(12) United States Patent
Boumaiza et al.

(10) Patent No.: US 8,981,850 B2
(45) Date of Patent: Mar. 17, 2015

(54) MULTI-FREQUENCY MULTI-STANDARD RECONFIGURABLE DOHERTY AMPLIFIER

(71) Applicant: Telefonaktiebolaget L M Ericsson (publ), Stockholm (SE)

(72) Inventors: Slim Boumaiza, Waterloo (CA); Ahmed Mohamed Mahmoud Mohamed, Waterloo (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 80 days.

(21) Appl. No.: 13/750,268

(22) Filed: Jan. 25, 2013

(65) Prior Publication Data

US 2014/0035681 A1     Feb. 6, 2014

Related U.S. Application Data

(60) Provisional application No. 61/678,870, filed on Aug. 2, 2012.

(51) Int. Cl.
*H03F 3/68* (2006.01)
*G06F 17/50* (2006.01)
*H03F 1/02* (2006.01)
*H03F 1/56* (2006.01)

(52) U.S. Cl.
CPC .............. *H03F 3/68* (2013.01); *G06F 17/5068* (2013.01); *H03F 1/0288* (2013.01); *H03F 1/56* (2013.01)
USPC ..................... 330/295; 330/124 R; 330/305

(58) Field of Classification Search
USPC .......... 330/295, 124 R, 53, 84, 286, 302, 305
See application file for complete search history.

(56) References Cited

U.S. PATENT DOCUMENTS

| | | | |
|---|---|---|---|
| 8,576,010 B2 * | 11/2013 | Yanduru et al. ............... | 330/295 |
| 2006/0246855 A1 | 11/2006 | Kato et al. | |
| 2010/0033243 A1 | 2/2010 | Okazaki et al. | |
| 2011/0279178 A1 | 11/2011 | Outaleb et al. | |

OTHER PUBLICATIONS

International Search Report and Written Opinion dated Jan. 10, 2014 for International Application No. PCT/IB2013/056328, International Filing Date Aug. 1, 2013 consisting of 10 pages.
Karun et al.: "Double the Band and Optimize", IEEE Microwave Magazine, IEEEService Center, Piscataway, NJ, US, vol. 13(2), Mar. 9, 2012, pp. 69-82, XP011434053, ISSN: 1527-3342, DOI: 10.1109/MMM.2011.2181449 figure 9 consisting of 14-pages.

* cited by examiner

*Primary Examiner* — Hieu Nguyen
(74) *Attorney, Agent, or Firm* — Christopher & Weisberg, P.A.

(57) ABSTRACT

A method and system for designing and implementing a reconfigurable Doherty amplifier system are disclosed. In one embodiment, a design method includes determining, using a processor, a first set of ABCD transmission parameters of a first output compensation network in a main path of a Doherty amplifier for the case where an auxiliary amplifier of the Doherty amplifier is off. The method further includes determining, using a processor, a second set of ABCD transmission parameters of a second output compensation network in an auxiliary path of the Doherty amplifier based on the first set of ABCD transmission parameters.

19 Claims, 10 Drawing Sheets

MULTI-FREQUENCY MULTI-STANDARD RECONFIGURABLE DOHERTY AMPLIFIER

CROSS-REFERENCE TO RELATED APPLICATION

This application is related to and claims priority to U.S. Provisional Application Ser. No. 61/678,870, filed Aug. 2, 2012, entitled "MULTI-FREQUENCY MULTI-STANDARD RECONFIGURABLE DOHERTY AMPLIFIER", the entirety of which is incorporated herein by reference.

TECHNICAL FIELD

The present invention relates to signal amplifiers, and more particularly, to reconfigurable Doherty amplifiers.

BACKGROUND

Recent evolutions of wireless communications systems have resulted in a broad spectrum of standards, each standard specifying different frequencies and bandwidths for wireless communication. These multiple standards are expected to co-exist, and dynamic management of multiple wireless network standards has become essential. This calls for a shift from dedicated single carrier frequency radio systems to versatile and adaptive systems capable of efficiently handling wide spread frequency bands. In other words, future radio systems should be able to cope with dissimilar center frequencies and signal bandwidths imposed by diverse standards while maintaining competitive performance. In particular, power amplifiers of radio transceivers should be able to amplify signals for different standards and frequencies.

Referring to the drawing figures, there is shown in FIG. 1 a block diagram of a known Doherty amplifier 10 used to amplify signals in a wireless communication system. For example, the Doherty amplifier 10 of FIG. 1 may amplify signals to be transmitted by an antenna over an air interface. Also, the Doherty amplifier 10 of FIG. 1 may amplify signals received by an antenna from the air interface. The Doherty technique was first introduced in 1936. It is an approach for actively modulating the load seen by a main transistor of a power amplifier to improve its efficiency in the back-off condition via a judiciously configured auxiliary transistor.

The Doherty amplifier 10 has a main amplifier 12, an auxiliary amplifier 14, and an input power divider 16. The outputs of the main amplifier 12 and the auxiliary amplifier 14 are coupled to a combining network consisting of impedance inverters with characteristic impedance $R_T$ 30 and $Z_T$ 32. The main power amplifier 12 includes an input matching network 18, a power transistor 20 and an output matching network 22. Similarly, the auxiliary amplifier 14 includes an input matching network 24, a power transistor 26 and an output matching network 28.

The main amplifier 12 is Class AB biased and matched to ensure peak efficiency at a predetermined p-dB back-off that corresponds to a peak to average power ratio, PAPR, of the input signal. The input signal voltage at the specific back-off is given by $$V_{in} = \frac{V_{in,max}}{p},$$

where $V_{in,max}$ is the maximum input voltage of the input signal. The auxiliary amplifier 14 is Class C biased and starts conducting at $$V_{in} = \frac{V_{in,max}}{p}.$$

In the high power region, $$\frac{I_{aux}}{I_{main}} = \frac{p\alpha(p-1)}{1+(p-1)\alpha}$$

and the ratio of the two transistor currents is given by $$V_{in} \geq \frac{V_{in,max}}{p},$$

where $\alpha=0$ at $$V_{in} = \frac{V_{in,max}}{p}$$

and increases slowly to 1 when $V_{in}=V_{in,max}$. Given the input signal PABR, p, the combining network element parameters are given by:

$$R_T = R_{opt},$$

$$Z_{T1} = \frac{R_{opt}}{\sqrt{p}} = \frac{R_T}{\sqrt{p}}$$

Assuming that the transistors 20 and 26 are ideal, the impedances of the main amplifier 12 and the auxiliary amplifier 14 vary as a function of the input signal according to the following expressions:

$$Z_{main} = \begin{cases} pR_T & 0 \leq V_{in} \leq \frac{V_{in,max}}{p} \\ pR_T\left(1 - \frac{\alpha(p-1)}{1+(p-1)\alpha}\right) & \frac{V_{in,max}}{p} \leq V_{in} \leq V_{in,max} \end{cases}$$

$$Z_{aux} = \begin{cases} \infty & 0 \leq V_{in} \leq \frac{V_{in,max}}{p} \\ \frac{R_T}{p\left(1 + \frac{1+(p-1)\alpha}{p(p-1)\alpha}\right)} & \frac{V_{in,max}}{p} \leq V_{in} \leq V_{in,max} \end{cases}$$

To maintain good average efficiency, the load modulation of the Doherty amplifier 10 should be adjusted as a function of the PAPR. In addition, the auxiliary transistor 26 should supply a drain current (p−1) times larger than the current of the main transistor 20 at peak power. The resulting efficiency versus input power level varies as a function of frequency. As the frequency varies, the load modulation in the Doherty amplifier 10 is affected as a direct result of the variation of the electrical lengths of the impedance inverters with frequency. Hence, the impedance seen by the main transistor 20 deviates from the ideal case and consequently, the efficiency of the Doherty amplifier 10 deteriorates. Thus, the improper load modulation resulting from the frequency variation yields an accentuated degradation of efficiency versus frequency as the value of p increases.

Therefore, the conventional Doherty amplifier 10 does not perform well for multiple frequencies and multiple standards.

SUMMARY

The present invention advantageously provides a method for designing a reconfigurable Doherty amplifier system that includes determining, using a processor, a first set of ABCD transmission parameters of a first output compensation network in a main path of a Doherty amplifier for the case where an auxiliary amplifier of the Doherty amplifier is off. The method further includes determining, using a processor, a second set of ABCD transmission parameters of a second output compensation network in an auxiliary path of the Doherty amplifier based on the first set of ABCD transmission parameters.

According to this aspect, the first set of ABCD transmission parameters are determined based on a desired impedance transformation of a main amplifier in the main path of the Doherty amplifier. The first set of ABCD transmission parameters may be determined based on a product of a first matrix based on a transmission line of a first characteristic impedance, $R_T$, and a second matrix based on a transmission line of a second characteristic impedance, $Z_{T1}=R_T/\sqrt{2}$, the two transmission lines being coupled to an output of the first output compensation network. In particular, the first set of ABCD transmission parameters are determined based on the following equation:

$$\begin{bmatrix} -\sqrt{p} & 0 \\ 0 & -\frac{1}{\sqrt{p}} \end{bmatrix} =$$

$$\begin{bmatrix} A & B \\ C & D \end{bmatrix}_{OCD_{main}} \begin{bmatrix} \cos^2\theta - \sqrt{2}\sin^2\theta & jR_T\left(1+\frac{1}{\sqrt{2}}\right) \\ j\frac{1}{R_T}(1+\sqrt{2})\sin\theta\cos\theta & \cos^2\theta - \frac{1}{\sqrt{2}}\sin^2\theta \end{bmatrix} \begin{bmatrix} -\sqrt{\frac{p}{2}} & 0 \\ 0 & -\sqrt{\frac{2}{p}} \end{bmatrix}$$

where $\theta$ is a frequency of operation of the Doherty amplifier, p is a desired peak to average power ratio, and $R_T$ is a load resistance. The second set of ABCD transmission parameters may be determined based on a product of a first matrix based on a transmission line of a first characteristic impedance, $R_T$, and a second matrix based on a transmission line of a second characteristic impedance, $Z_{T1}=R_T/\sqrt{2}$, wherein the two transmission lines are coupled to an output of the second output compensation network. In particular, the second set of ABCD transmission parameters may be determined based on the following equation:

$$\begin{bmatrix} jp & jR_T \\ \frac{j}{R_T} & 0 \end{bmatrix} = \begin{bmatrix} A & B \\ C & D \end{bmatrix}_{OCD_{main}}$$

-continued $$\begin{bmatrix} \dfrac{\cos^2\theta - \sqrt{2}\sin^2\theta + j\left(1+\frac{1}{\sqrt{2}}\right)\sin\theta\cos\theta}{\cos\theta + j\frac{1}{\sqrt{2}}\sin\theta} & jR_T\sin\theta \\ \dfrac{1}{R_T}\dfrac{\cos^2\theta - \frac{1}{\sqrt{2}}\sin^2\theta + j(1+\sqrt{2})\sin\theta\cos\theta}{\cos\theta + j\frac{1}{\sqrt{2}}\sin\theta} & \cos\theta \end{bmatrix}$$

$$\begin{bmatrix} A & B \\ C & D \end{bmatrix}_{OCD_{aux}} \begin{bmatrix} 1 & 0 \\ \frac{p-2}{R_T} & 1 \end{bmatrix}$$

The first output compensation network may be implemented to include at least one of micro-electro-mechanical systems, MEMS, semiconductor varactors and ferroelectric material. In some embodiments, the first output compensation network and the second output compensation network include a total of less than 9 tunable circuits to achieve the first set of ABCD transmission parameters and the second set of ABCD transmission parameters. In other embodiments, the first output compensation network and the second output compensation network include a total of less than 6 tunable circuits to achieve the first set of ABCD transmission parameters and the second set of ABCD transmission parameters.

According to another aspect, the invention provides a reconfigurable power amplifier. The reconfigurable power amplifier includes a main amplifier and an auxiliary amplifier. The main amplifier is configured to operate using a specific impedance below a first predetermined power level. The auxiliary amplifier is configured to modulate the impedance of the main amplifier above the first predetermined power level. The power amplifier further includes a first reconfigurable output network coupled to an output of the main amplifier, and a second reconfigurable output network coupled to an output of the auxiliary amplifier. The power amplifier further includes a non-reconfigurable output impedance inverter coupled to the first reconfigurable output network and the second reconfigurable output network.

According to this aspect, in some embodiments, the first reconfigurable output network exhibits predetermined ABCD transmission parameters based on a desired load modulation. In some embodiments, the first reconfigurable output network and the second reconfigurable output network are configured to compensate for a frequency dependence of the non-reconfigurable output impedance inverter. Some embodiments further include a reconfigurable input matching network coupled to an input of the main amplifier. The reconfigurable input matching network may be configured to provide source matching and phase balancing at a frequency of operation of the power amplifier. In some embodiments, the first reconfigurable output network is configured to provide second harmonic impedance matching at a frequency of operation of the power amplifier. In some embodiments, the first reconfigurable output network is implemented using shunt discrete single-pole double-throw micro-electrical-mechanical systems, MEMS switch. In some embodiments, the first reconfigurable output network and the second reconfigurable output network are configured to provide a single standard multi-frequency Doherty amplifier using a total of not more than five tunable elements. In some embodiments, the first reconfigurable output network and the second reconfigurable output network are configured to provide a single-frequency multi-standard Doherty amplifier using a total of not more than four tunable elements. In some embodiments, the first reconfigurable output network and the second reconfigurable output network are configured to provide a multi-frequency multi-standard Doherty amplifier using a total of not more than eight tunable elements.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION OF THE INVENTION

Figure 1:
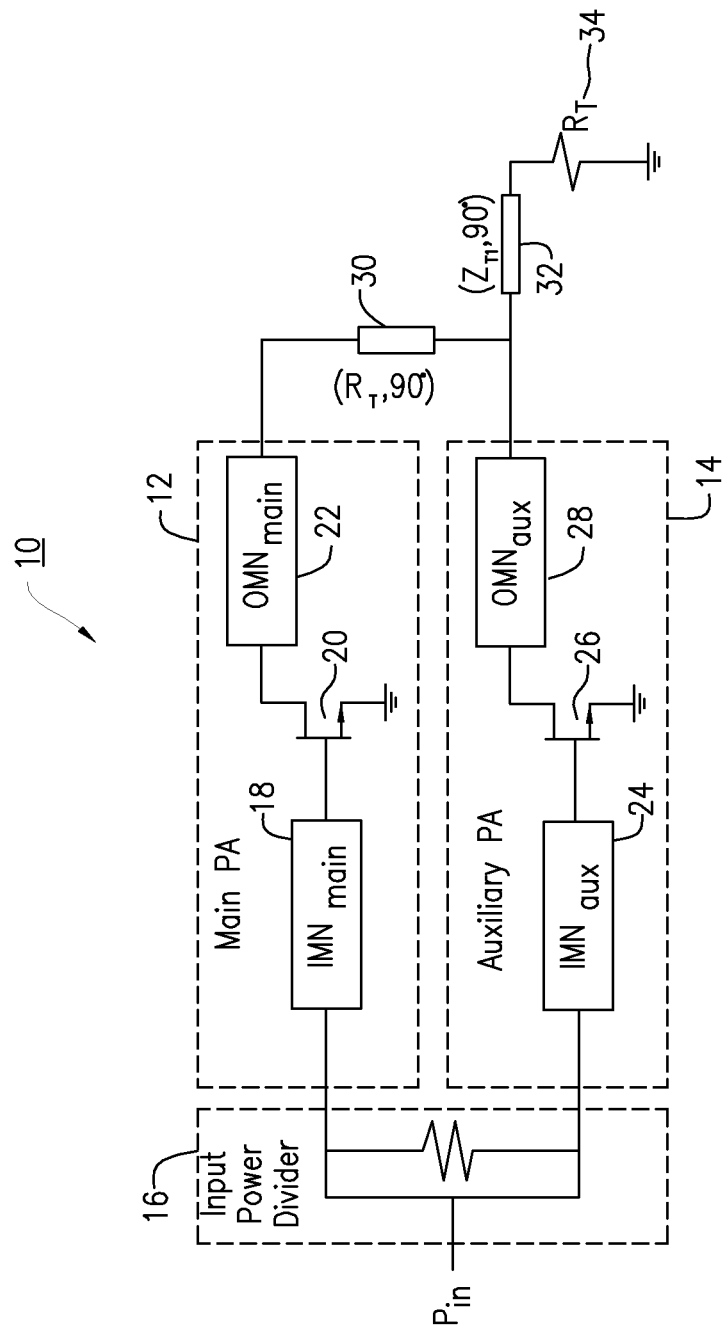
FIG. 1 is a diagram of a known Doherty amplifier.

Before describing in detail exemplary embodiments that are in accordance with the present invention, it is noted that the embodiments reside primarily in combinations of apparatus components and processing steps related to reconfigurable Doherty amplifiers. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

To mitigate the effects of frequency variations and peak to average power ratio, PAPR, variations in a conventional Doherty amplifier, a reconfigurable Doherty architecture is described herein. The reconfigurable Doherty architecture includes two reconfigurable output compensation networks (OCN) that are added in the main and auxiliary paths of the Doherty architecture in addition to reconfigurable input and output matching networks. The reconfigurable OCNs are carefully designed to reduce the deviation of the impedance profiles from the ideal profiles and to adjust the impedance profiles as the value of p varies. The reconfigurable input and output matching networks (IMN, OMN) and the output compensation networks, OCN, are designed to obtain optimal source and load impedances to be seen by the transistors at different drive levels and operating frequencies, and to compensate for the transistors' parasitics at different operating conditions.

Design of the compensation networks may follow a procedure that employs a set of closed form equations. These equations enable determination of ABCD parameters of the compensation networks given the values of the frequency (represented by θ), and the input signal PAPR (represented by p).

Figure 2:
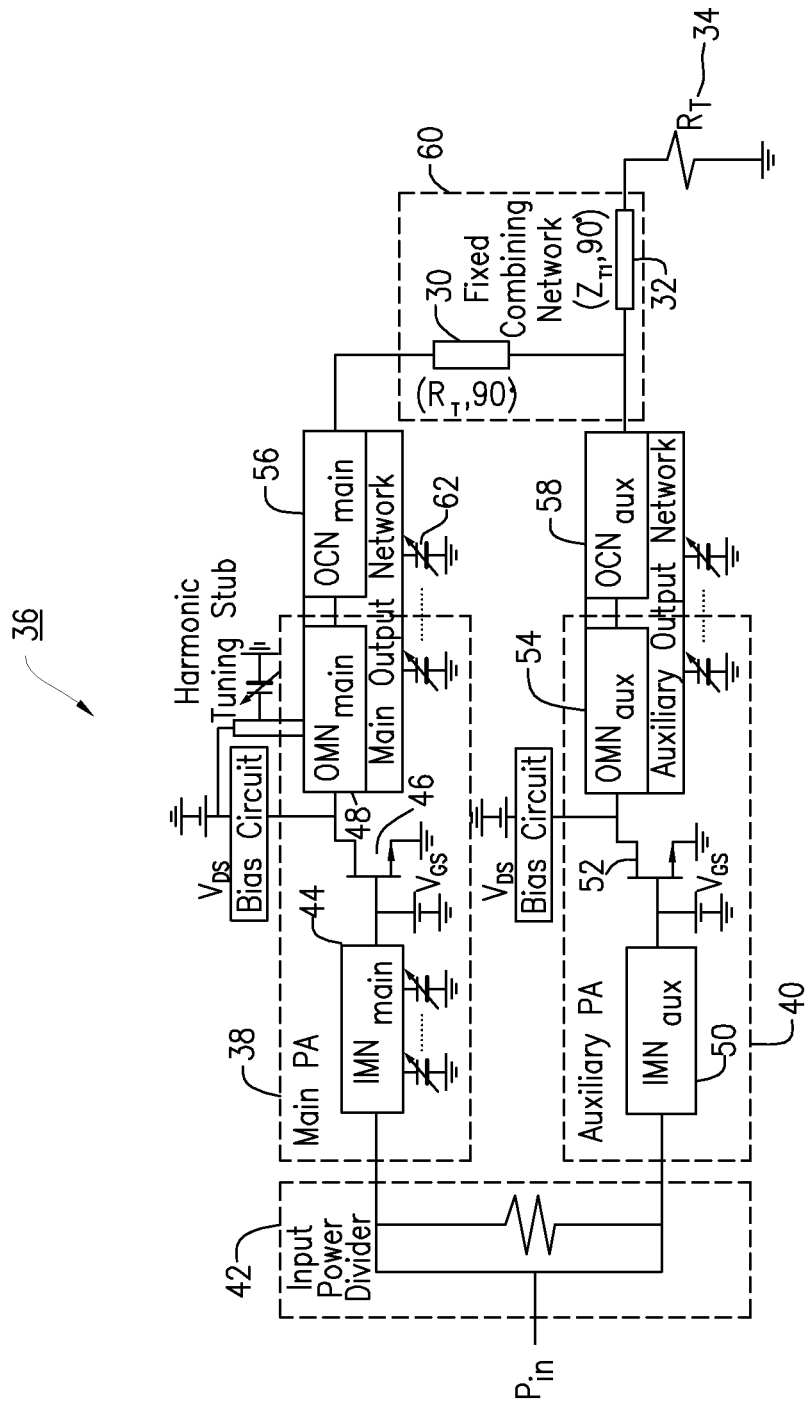
FIG. 2 is a diagram of a multi-frequency multi-standard Doherty amplifier system designed and constructed according to principles of the present invention.

Referring to the drawing figures, there is shown in FIG. 2 a generalized multi-standard multi-frequency Doherty amplifier system 36 constructed in accordance with principles of the present invention. The Doherty amplifier system 36 includes a main power amplifier 38, an auxiliary power amplifier 40 and an input power divider 42. The main power amplifier 38 has a reconfigurable input matching network 44, a transistor 46 and a reconfigurable output matching network 48. The auxiliary power amplifier 40 has an input matching network 50, a transistor 52 and a reconfigurable output matching network 54. Note that, in one embodiment, the transistor 52 of the auxiliary power amplifier 40 may have a power rating of 2.5 times the power rating of the transistor 46 of the main power amplifier 38. For example the transistor 52 may be rated at 10 Watts and the transistor 46 may be rated at 25 Watts.

The output path of the main power amplifier 38 includes a reconfigurable output compensation network 56. The output path of the auxiliary power amplifier 40 includes a reconfigurable output compensation network 58. The output compensation networks 56 and 58 are electrically coupled to a fixed combining network 60 that includes the impedances 30, 32 and 34. In this embodiment, the fixed combining network 60 is unchanged from the known combining network of FIG. 1.

The fixed combining network 60 may also be referred to herein as a non-reconfigurable output impedance inverter. The output networks that include the output matching network 48 and the output compensation network 56, as well as the output matching network 54 and the output compensation network 58, combine to compensate for a frequency dependence of the non-reconfigurable output impedance inverter 60 and/or to compensate for a PAPR dependence of the non-reconfigurable impedance inverter 60. Also, the output network that includes output matching network 48 and output compensation network 56 may be configured to provide second harmonic impedance matching at an operating frequency of the Doherty power amplifier 36. The input matching networks compensate for transistor parasitics and variation of the source impedance with frequency.

The synthesis of the reconfigurable Doherty amplifier system 36 may be carried out in two steps. First, the ABCD parameters of the output compensation network 56 are determined by analyzing the circuit that results from turning off the auxiliary power amplifier 40 at low power levels. Second, the knowledge of the output compensation network 56 is used for determining the ABCD parameters of the output compensation network 58. In both cases, the ideal ABCD parameters are chosen to satisfy the conditions for proper load modulation.

The first set of ABCD parameters may be determined based on a desired impedance transformation of the main amplifier 38 in the main path of the Doherty amplifier system 36. For example, the first set of ABCD transmission parameters may be determined based on a product of a first matrix based on a transmission line of the first characteristic impedance, $R_T$, and a second matrix based on a transmission line of the second characteristic impedance, $Z_{T1}=R_T/\sqrt{2}$. The two transmission lines are coupled to an output of the first output compensation network 56. More particularly, the first set of ABCD parameters for the output compensation network 56 may be given by:

$$\begin{bmatrix} -\sqrt{p} & 0 \\ 0 & -\frac{1}{\sqrt{p}} \end{bmatrix} =$$

$$\begin{bmatrix} A & B \\ C & D \end{bmatrix}_{OCD_{main}} \begin{bmatrix} \cos^2\theta - \sqrt{2}\sin^2\theta & jR_T\left(1 + \frac{1}{\sqrt{2}}\right)\sin\theta\cos\theta \\ j\frac{1}{R_T}(1+\sqrt{2})\sin\theta\cos\theta & \cos^2\theta - \frac{1}{\sqrt{2}}\sin^2\theta \end{bmatrix} \begin{bmatrix} -\sqrt{\frac{p}{2}} & 0 \\ 0 & -\sqrt{\frac{2}{p}} \end{bmatrix}$$

where $\theta$ is a frequency of operation of the Doherty amplifier, p is a desired peak to average power ratio, and $R_T$ is a load resistance.

The second set of ABCD transmission parameters are determined based on a product of a first matrix based on the transmission line of the first characteristic impedance, $R_T$, and a second matrix based on the transmission line of the second characteristic impedance, $Z_{T1}=R_T/\sqrt{2}$. The two transmission lines are coupled to an output of the second output compensation network 58 and the output of the first output compensation network 56. More particularly, the second set of ABCD transmission parameters may be determined based on the following equation:

$$\begin{bmatrix} jp & jR_T \\ \frac{j}{R_T} & 0 \end{bmatrix} = \begin{bmatrix} A & B \\ C & D \end{bmatrix}_{OCD_{main}}$$

$$\begin{bmatrix} \frac{\cos^2\theta - \sqrt{2}\sin^2\theta + j\left(1+\frac{1}{\sqrt{2}}\right)\sin\theta\cos\theta}{\cos\theta + j\frac{1}{\sqrt{2}}\sin\theta} & jR_T\sin\theta \\ \frac{1}{R_T}\frac{\cos^2\theta - \frac{1}{\sqrt{2}}\sin^2\theta + j(1+\sqrt{2})\sin\theta\cos\theta}{\cos\theta + j\frac{1}{\sqrt{2}}\sin\theta} & \cos\theta \end{bmatrix}$$

$$\begin{bmatrix} A & B \\ C & D \end{bmatrix}_{OCD_{aux}} \begin{bmatrix} 1 & 0 \\ \frac{p-2}{R_T} & 1 \end{bmatrix}$$

These closed form equations enable design of the output compensation networks 56, 58 to maintain proper load modulation given the operating frequencies and the desired PAPR. When these ABCD parameters are realized by tunable circuits 62, such as micro-electromechanical systems, MEMS, switches, the output network formed by the combination of output matching network 48 and output compensation network 56 of the Doherty amplifier system 36 accounts for the frequency dependency of the fixed combining network 60. The input matching network 44 accounts for the effects of transistor parasitics and the variation-of the source impedance with frequency by performing source matching and phase balancing. These variations may be mitigated using the MEMS switches, or, in an alternative embodiment, using semiconductor varactors or ferroelectric material. A minimum number of tunable elements 62, such as single pole-double throw MEMS switches, may be determined by performing a sensitivity analysis of a multi-step transmission line based matching network to identify the most effective segment of transmission lines that maximize the tuning range.

Figure 3:
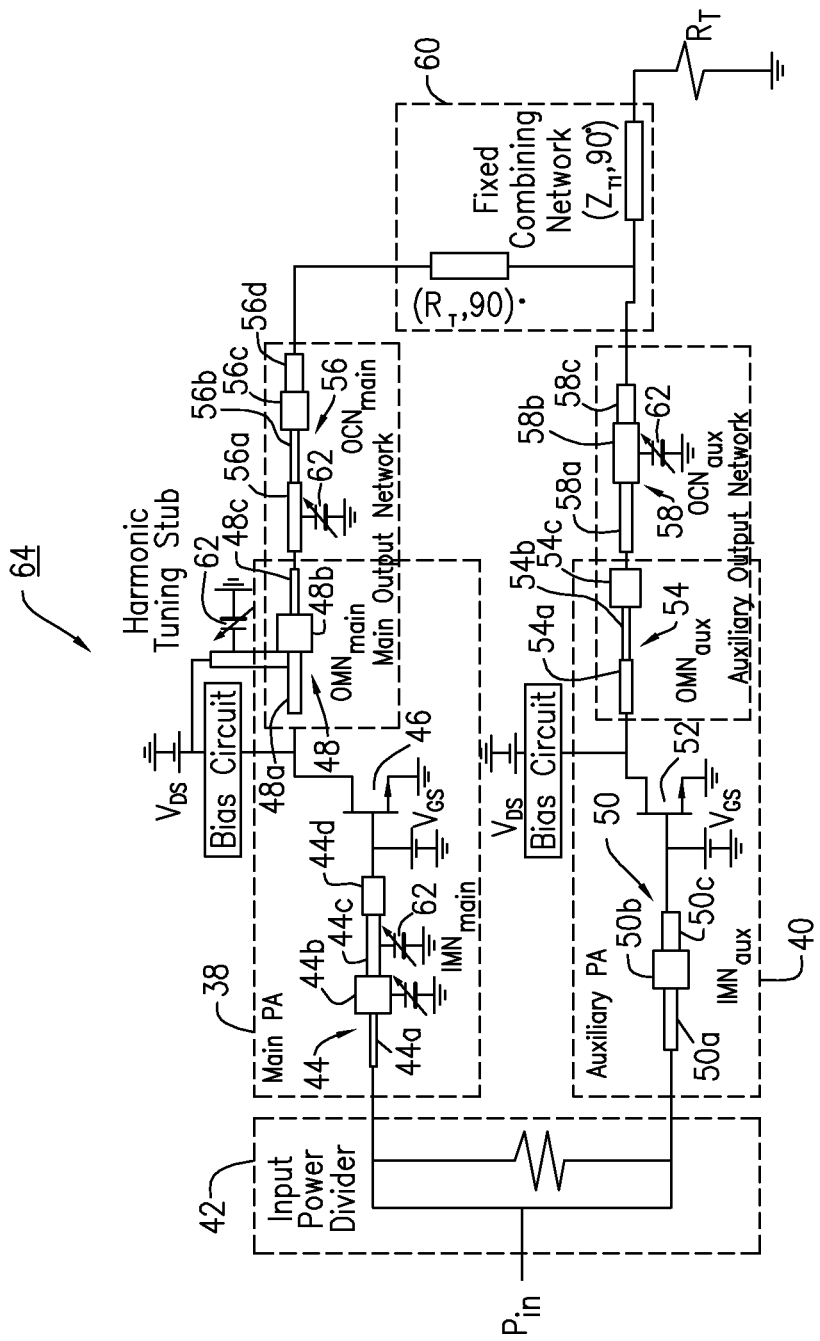
FIG. 3 is a diagram of a multi-frequency single standard Doherty amplifier system designed and constructed according to principles of the present invention.

FIG. 3 is a diagram of a multi-frequency single standard Doherty amplifier 64 designed and constructed in accordance with principles of the present invention. In particular, the Doherty amplifier system 64 exhibits high efficiency for multiple frequencies when driven by a constant PAPR signal. The Doherty amplifier system 64 of FIG. 3 may be designed to operate at 1.9, 2.14 and 2.6 Gigahertz, GHz, for a PAPR of 6 dB (p=2). In particular, the combination of the output matching network 48 and the output compensation network 56 may achieve optimal second harmonic termination for efficiency enhancement. Simulations of the configuration of FIG. 3 indicate that good performance can be achieved using five tunable elements 62.

As shown in FIG. 3 the input matching network 44 includes four transmission lines 44a-44d with two tunable elements 62 attached to two of the transmission lines. The output matching network 48 includes three transmission lines 48a-48c. The input matching network 50 also includes three transmission lines 50a-50c. The output matching network 54 includes three transmission lines 54a-54c. The output compensation network 56 includes four transmission lines 56a-56d and one tunable element 62. The output compensation network 58 also includes three transmission lines 58a-58c and one tunable element 62. The length and width of the transmission lines can be determined by computer analysis using known techniques based on the calculated ABCD parameters.

Figure 4:
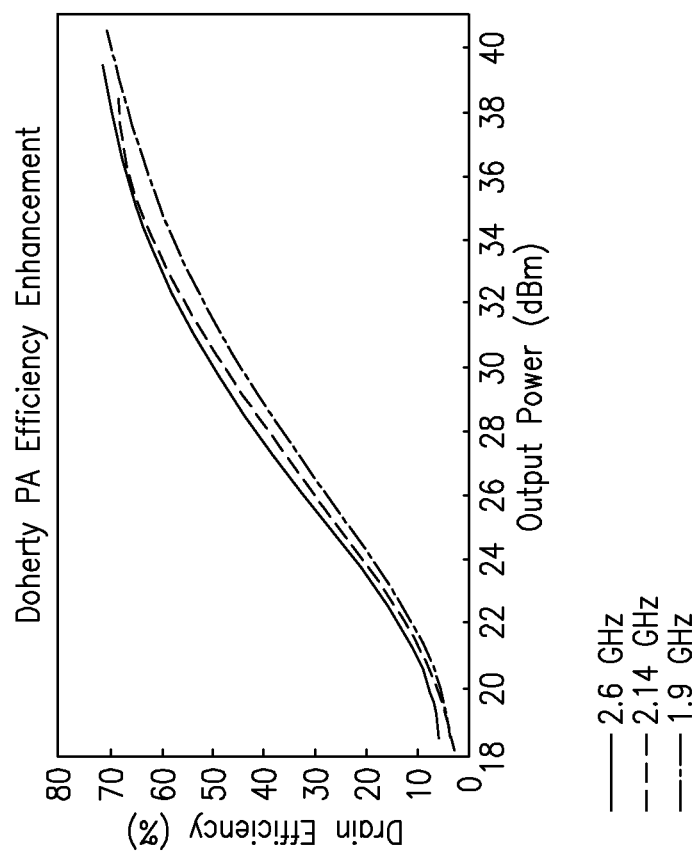
FIG. 4 is a graph of drain current efficiency for the system of FIG. 3.

FIG. 4 is a graph of drain current efficiencies of the Doherty amplifier system 64 for each of the three frequencies for which the Doherty amplifier system 64 is tuned. The graph of FIG. 4 shows that drain efficiency of about 70% is achieved at peak power levels of 40 dB. In addition, a drain efficiency of about 60% is maintained at a 6 dB output back-off over the three frequencies.

Figure 5:
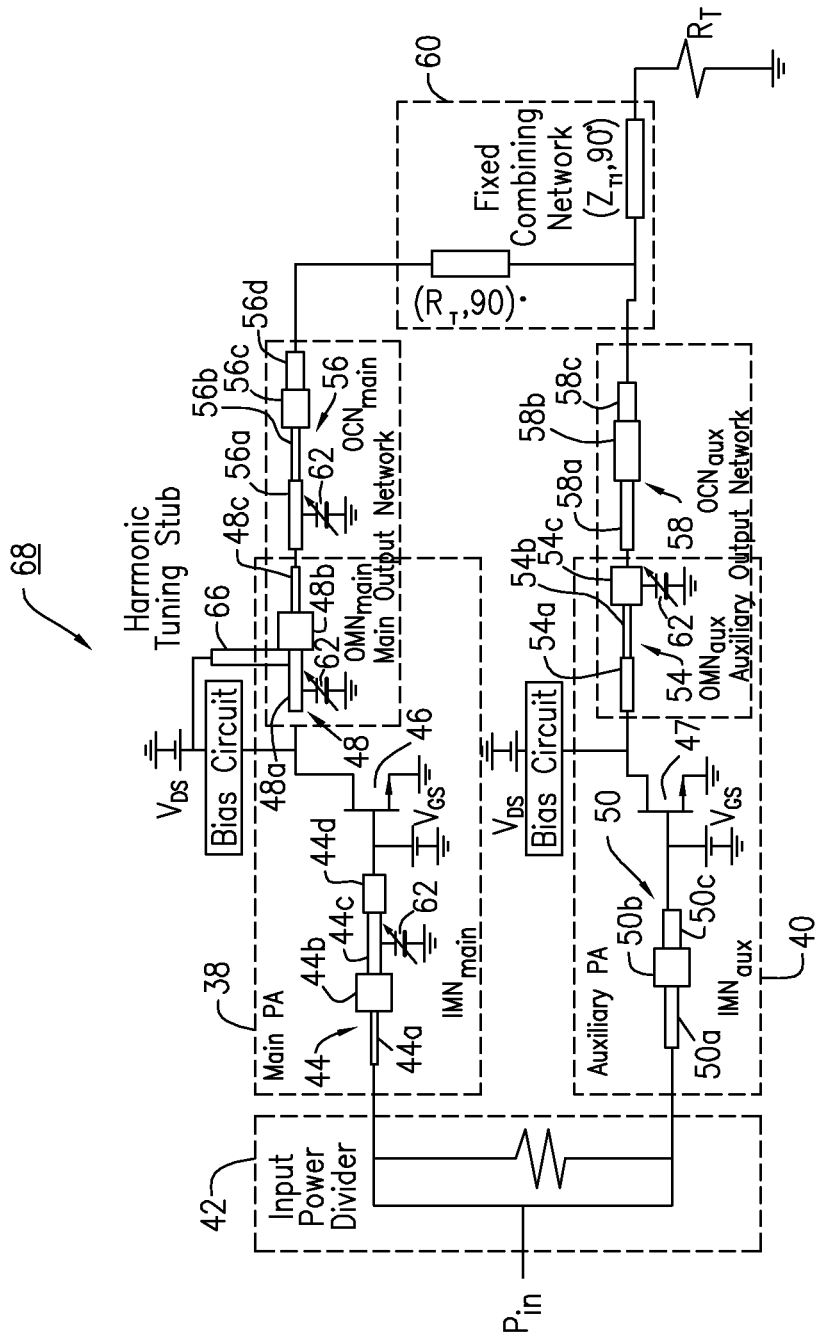
FIG. 5 is a diagram of a single frequency multi-standard Doherty amplifier system designed and constructed according to principles of the present invention.

FIG. 5 is a diagram of a single frequency multi-standard Doherty amplifier system 68 designed and constructed in accordance with principles of the present invention. In particular, the Doherty amplifier system 68 achieves high average efficiency when the amplifier is operated at a single frequency but driven with signals having varying PAPR. In some embodiments, the Doherty amplifier system 66 operates at a center frequency of 2.6 GHz and for 6, 9 and 12 dB back-off levels. Note that the back-off levels are directly related to a signal's PABR and probability density function. Simulations show that four tunable elements 62 may be sufficient for circuit realization, when used in conjunction with a fixed harmonic tuning stub 66.

A difference between the embodiments of FIGS. 3 and 5 is the number of tunable elements in each of the matching and compensation networks. For example, the embodiment of FIG. 3 has two tunable elements 62 in the input matching network 44, whereas the embodiment of FIG. 5 has only one tunable element 62 in the input matching network 44. In the embodiment of FIG. 5, the output matching network has one tunable element 62, whereas in FIG. 3, the output matching network 48 has no tunable element. Also, the embodiment of FIG. 5 includes a tunable element 62 in the output matching network 54, whereas the output matching network 54 of FIG. 3 has no tunable element. Also, the dimensions of the tunable elements may be different for the different embodiments. As mentioned, the length and width of the transmission lines can be determined by computer analysis using known techniques based on the calculated ABCD parameters.

Figure 6:
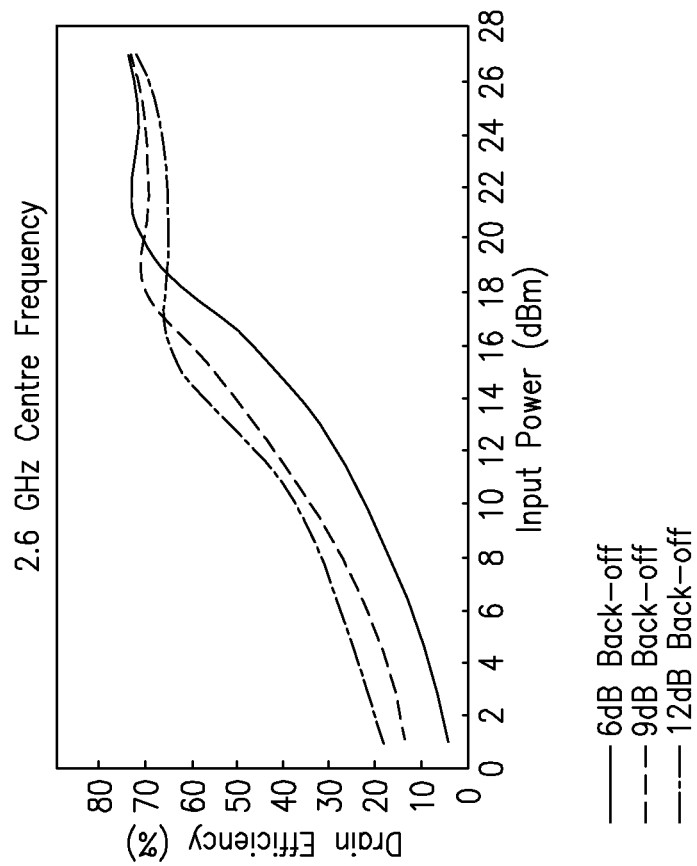
FIG. 6 is a graph of drain current efficiency for the system of FIG. 5.

FIG. 6 is a graph of drain current efficiency for the three different back-off levels. The graph shows a peak efficiency of about 71% while back-off efficiency exceeds 65% for the 6, 9 and 12 dB back-off levels. According to FIG. 6, the peak power is about 27 dBm. Hence, the 6, 9 and 12 dB back-off levels correspond to an input power of 21, 18, and 15 dBm, respectively.

Figure 7:
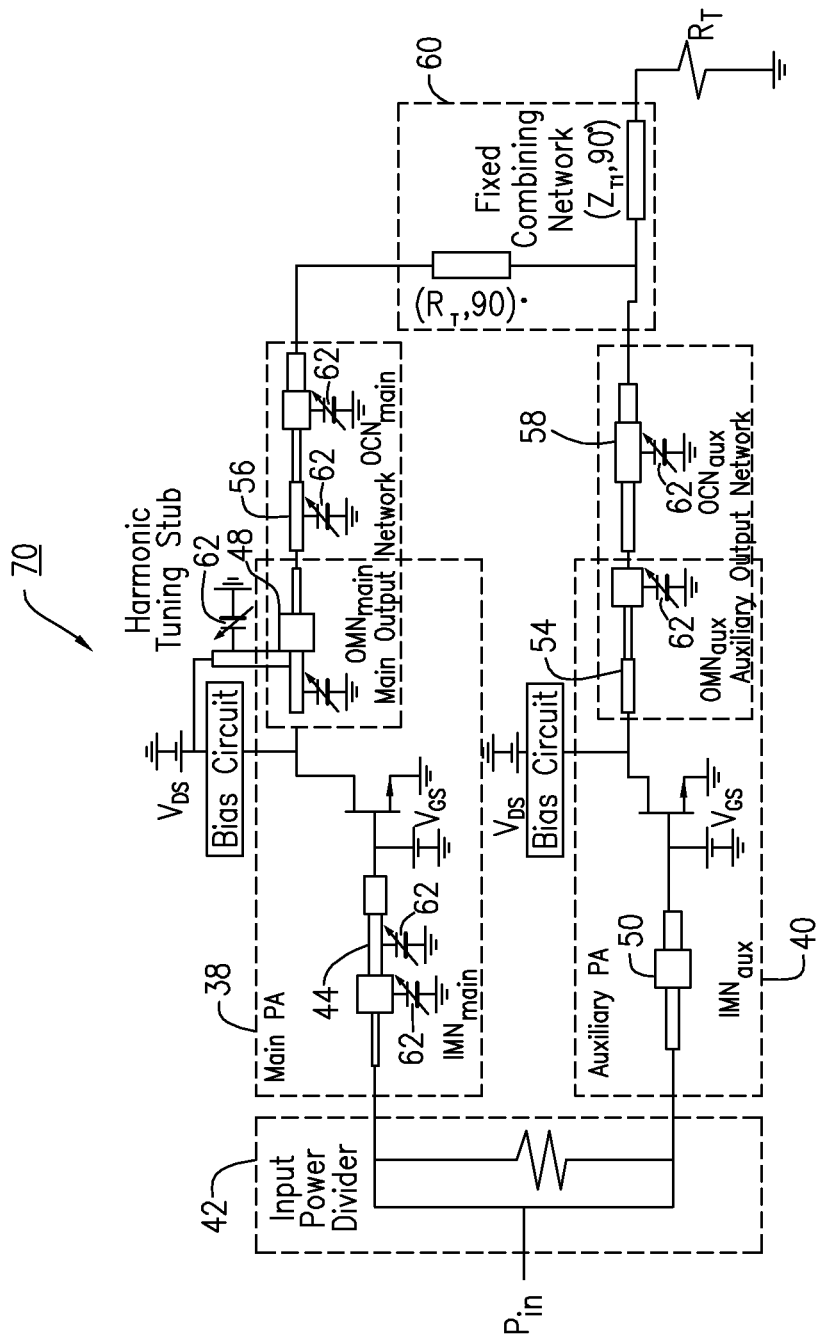
FIG. 7 is a diagram of another multi-frequency multi-standard Doherty amplifier system designed and constructed according to principles of the present invention.

FIG. 7 is a diagram of a multi-frequency multi-standard Doherty amplifier system 70 designed and constructed in accordance with principles of the present invention. In particular, the Doherty amplifier system 70 achieves high average efficiency when the amplifier is operated at multiple frequencies and driven with signals having varying PAPR. In some embodiments, the Doherty amplifier system 70 is tunable with eight tunable elements 62 to operate at center frequencies of 1.9, 2.14 and 2.6 GHz and for back-off levels of 6, 9 and 12 dB.

Thus, a difference between the embodiments of FIGS. 3, 5, and 7 is the number of tunable elements 62 in each of the matching and compensation networks. For example, the number of tunable elements of the input matching network 44 of FIG. 7 is two, the number of tunable elements of the output matching network 48 of FIG. 7 is one, the number of tunable elements of the output compensation network 56 of FIG. 7 is 2, the number of tunable elements of the input matching network 50 of FIG. 7 is zero, the number of tunable elements of the output matching network 54 of FIG. 7 is one, and finally, the number of tunable elements of the output compensation network 58 is one. Also, the dimensions of the various transmission lines included in the matching and compensation networks may be different for the different embodiments.

Figure 8A:
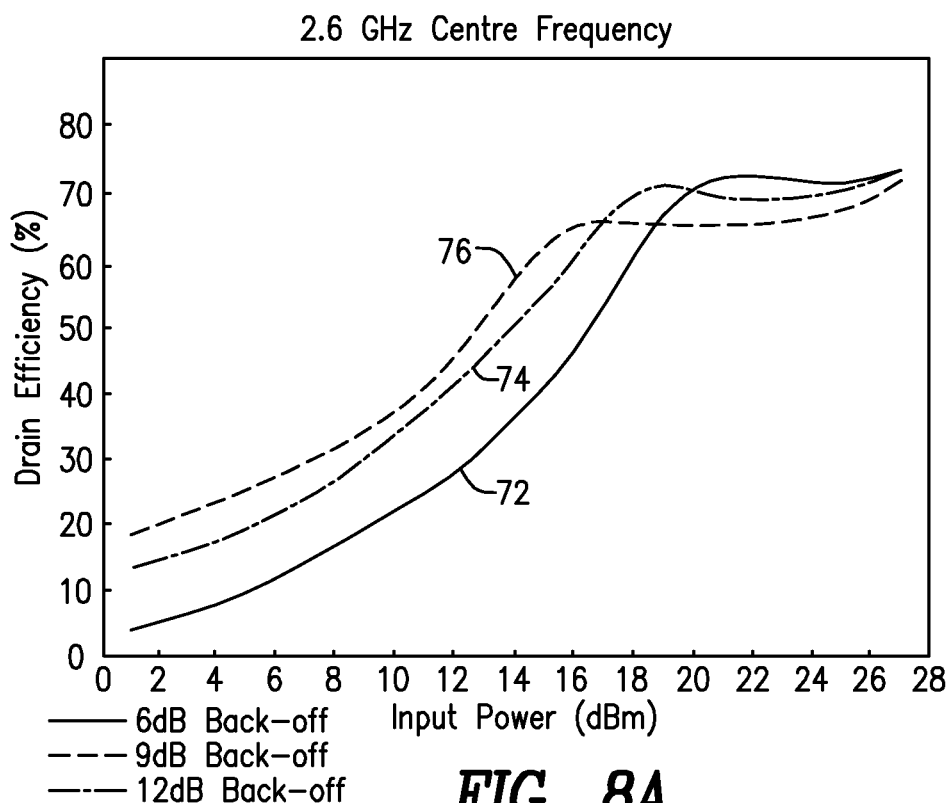
FIGS. 8A, 8B and 8C are graphs of drain current efficiencies at three different frequencies for the system of FIG. 7.
Figure 8B:
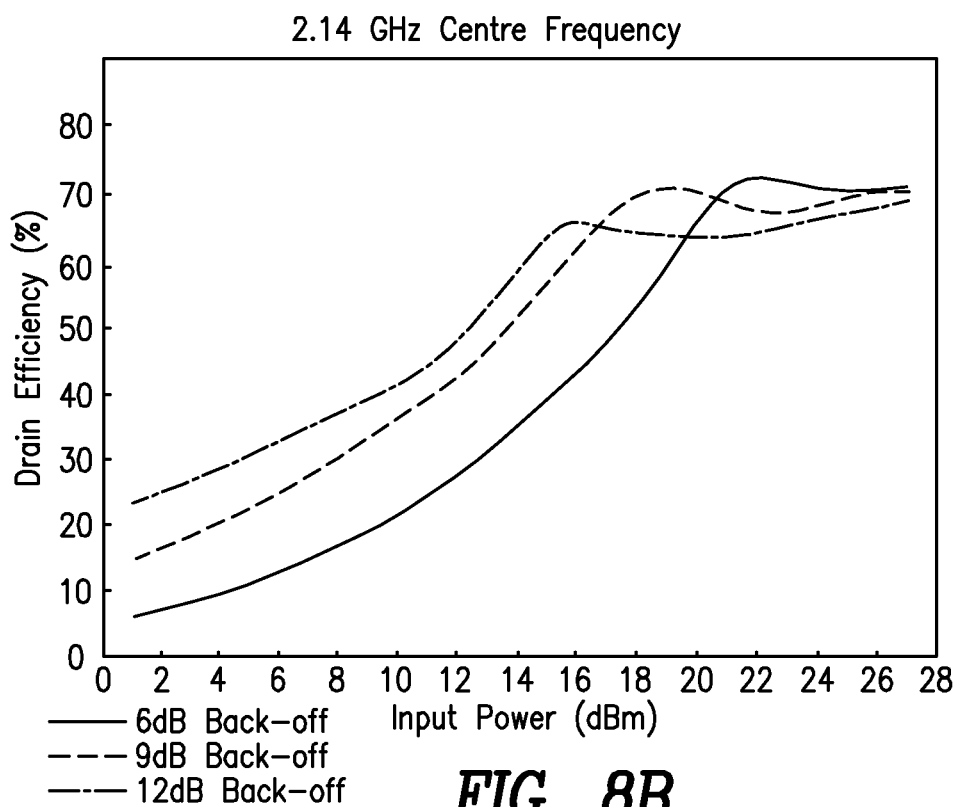
Figure 8C:
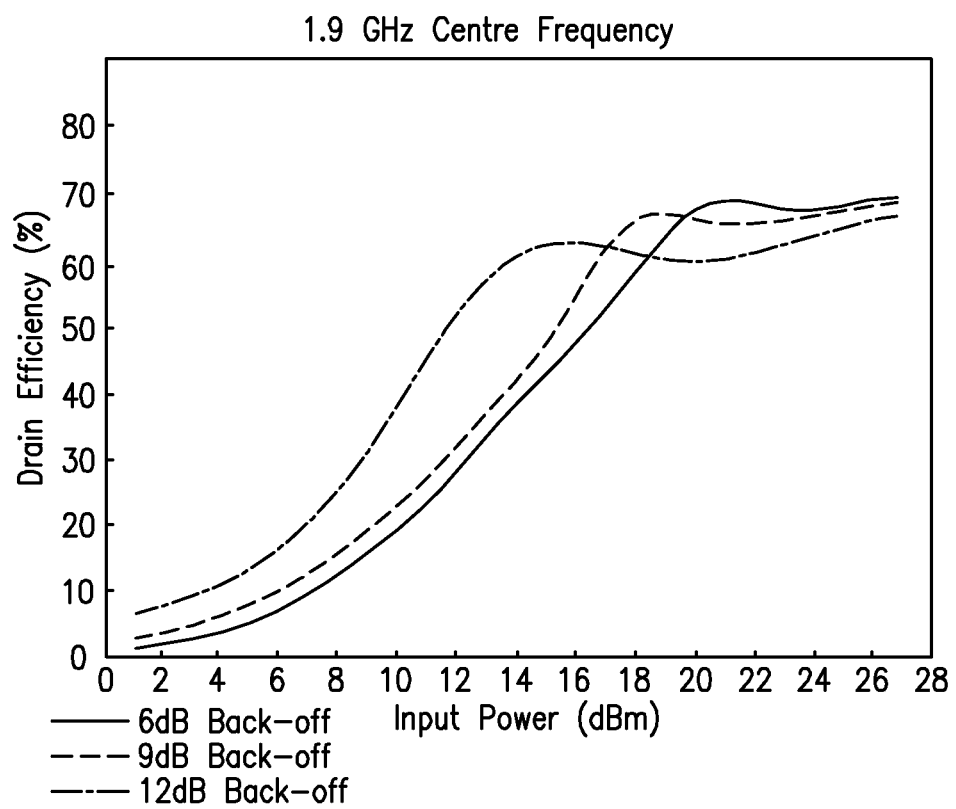

FIGS. 8A, 8B, and 8C are graphs of drain current efficiency for the embodiment of FIG. 7 for the three different frequencies, 2.6 Ghz (8A), 2.14 Ghz (8B) and 1.9 Ghz (8C) for the three back-off levels 6 dB 72, 9 dB 74 and 12 dB 76, demonstrating peak drain efficiency of more than 69% while the back-off efficiency exceeds 62%.

Figure 9:
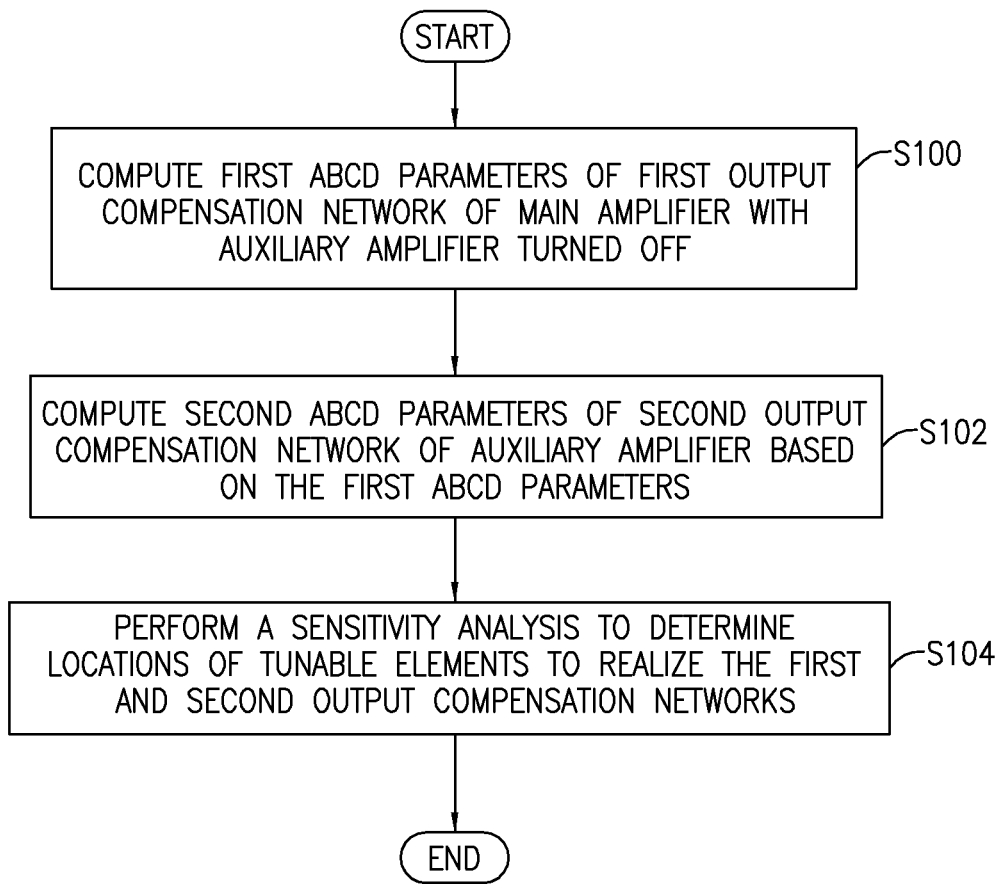
FIG. 9 is a flowchart of an exemplary process for designing a reconfigurable Doherty amplifier according to principles of the present invention.

FIG. 9 is a flowchart of an exemplary process for designing a reconfigurable Doherty amplifier system 64, 68, 70 according to principles of the present invention. First ABCD parameters are computed for a first output compensation network 56 in a path of the main amplifier 46 with the auxiliary amplifier 47 turned off (block S100). Second ABCD parameters are computed for a second output compensation network 58 in the path of the auxiliary amplifier 47 based on the first ABCD parameters (block S102). A sensitivity analysis is performed to determine locations of tunable elements 62 to realize the first and second output compensation networks 56, 58 (block S104).

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A method of designing a reconfigurable Doherty amplification system, the method comprising:

determining, using a processor, a first set of ABCD transmission parameters of a first output compensation network in a main path of a Doherty amplifier for the case where an auxiliary amplifier of the Doherty amplifier is off, the first set of ABCD transmission parameters based on a desired impedance transformation of a main amplifier in the main path of the Doherty amplifier; and determining, using a processor, a second set of ABCD transmission parameters of a second output compensation network in an auxiliary path of the Doherty amplifier based on the first set of ABCD transmission parameters.

2. The method of claim 1, wherein the first set of ABCD transmission parameters are determined based on a product of a first matrix based on a transmission line of a first characteristic impedance, RT, and a second matrix based on a transmission line of a second characteristic impedance, ZT1=RT/√2, the two transmission lines being coupled to an output of the first output compensation network.

3. The method of claim 1, wherein the first set of ABCD transmission parameters are determined based on the following equation:

$$\begin{bmatrix} -\sqrt{p} & 0 \\ 0 & -\frac{1}{\sqrt{p}} \end{bmatrix} =$$

$$\begin{bmatrix} A & B \\ C & D \end{bmatrix}_{OCD_{main}} \begin{bmatrix} \cos^2\theta - \sqrt{2}\sin^2\theta & jR_T\left(1 + \frac{1}{\sqrt{2}}\right)\sin\theta\cos\theta \\ j\frac{1}{R_T}(1 + \sqrt{2})\sin\theta\cos\theta & \cos^2\theta - \frac{1}{\sqrt{2}}\sin^2\theta \end{bmatrix} \begin{bmatrix} -\sqrt{\frac{p}{2}} & 0 \\ 0 & -\sqrt{\frac{2}{p}} \end{bmatrix}$$

where θ is a frequency of operation of the Doherty amplifier, p is a desired peak to average power ratio, and RT is a load resistance.

4. The method of claim 1, wherein the second set of ABCD transmission parameters are determined based on a product of a first matrix based on a transmission line of a first characteristic impedance, RT, and a second matrix based on a transmission line of a second characteristic impedance, ZT1=RT/√2, wherein the two transmission lines are coupled to an output of the second output compensation network.

5. The method of claim 1, wherein the second set of ABCD transmission parameters are determined based on the following equation:

$$\begin{bmatrix} jp & jR_T \\ \frac{j}{R_T} & 0 \end{bmatrix} = \begin{bmatrix} A & B \\ C & D \end{bmatrix}_{OCD_{main}}$$

$$\begin{bmatrix} \dfrac{\cos^2\theta - \sqrt{2}\sin^2\theta + j\left(1 + \frac{1}{\sqrt{2}}\right)\sin\theta\cos\theta}{\cos\theta + j\frac{1}{\sqrt{2}}\sin\theta} & jR_T\sin\theta \\ \dfrac{1}{R_T}\dfrac{\cos^2\theta - \frac{1}{\sqrt{2}}\sin^2\theta + j(1 + \sqrt{2})\sin\theta\cos\theta}{\cos\theta + j\frac{1}{\sqrt{2}}\sin\theta} & \cos\theta \end{bmatrix}$$

-continued $$\begin{bmatrix} A & B \\ C & D \end{bmatrix}_{OCD_{aux}} \begin{bmatrix} 1 & 0 \\ \frac{p-2}{R_T} & 1 \end{bmatrix}$$

where θ is a frequency of operation of the Doherty amplifier, p is a desired peak to average power ratio, and RT is a load resistance.

6. The method of claim 1, further comprising implementing the first output compensation network using at least one of micro-electro-mechanical systems, MEMS, semiconductor varactors and ferroelectric material.

7. The method of claim 1, wherein the first output compensation network and the second output compensation network include a total of less than 9 tunable circuits to achieve the first set of ABCD transmission parameters and the second set of ABCD transmission parameters.

8. The method of claim 1, further comprising performing a sensitivity analysis to determine a location of each of a plurality of tunable elements to realize the first and second output compensation networks.

9. A reconfigurable power amplifier, the power amplifier comprising:
a main amplifier configured to operate using a specific impedance below a first predetermined power level;
an auxiliary amplifier configured to modulate the impedance of the main amplifier above the first predetermined power level;
a first reconfigurable output network coupled to an output of the main amplifier, the first reconfigurable output network associated with a first set of ABCD parameters determined based on a desired impedance transformation of the main amplifier;
a second reconfigurable output network coupled to an output of the auxiliary amplifier, the second reconfigurable output network associated with a second set of ABCD parameters determined based on the first set of ABCD parameters; and
a non-reconfigurable output impedance inverter coupled to the first reconfigurable output network and the second reconfigurable output network.

10. The power amplifier of claim 9, wherein the first reconfigurable output network exhibits predetermined ABCD transmission parameters based on a desired load modulation.

11. The power amplifier of claim 9, wherein the first reconfigurable output network and the second reconfigurable output network are configured to compensate for a frequency dependence of the non-reconfigurable output impedance inverter.

12. The power amplifier of claim 9, wherein the first reconfigurable output network and the second reconfigurable output network are configured to compensate for a peak to average power ratio dependence of the non-reconfigurable output impedance inverter.

13. The power amplifier of claim 9, further comprising a reconfigurable input matching network coupled to an input of the main amplifier.

14. The power amplifier of claim 13, wherein the reconfigurable input matching network is configured to provide source matching and phase balancing at a frequency of operation of the power amplifier.

15. The power amplifier of claim 9, wherein the first reconfigurable output network is configured to provide second harmonic impedance matching at a frequency of operation of the power amplifier.

16. The power amplifier of claim 9, wherein the first reconfigurable output network is implemented using shunt discrete single-pole double-throw micro-electrical-mechanical systems, MEMS switch.

17. The power amplifier of claim 9, wherein the first reconfigurable output network and the second reconfigurable output network are configured to provide a single standard multi-frequency Doherty amplifier using a total of not more than five tunable elements.

18. The power amplifier of claim 9, wherein the first reconfigurable output network and the second reconfigurable output network are configured to provide a single-frequency multi-standard Doherty amplifier using a total of not more than four tunable elements.

19. The power amplifier of claim 9, wherein the first reconfigurable output network and the second reconfigurable output network are configured to provide a multi-frequency multi-standard Doherty amplifier using a total of not more than eight tunable elements.

* * * * *

UNITED STATES PATENT AND TRADEMARK OFFICE
CERTIFICATE OF CORRECTION

PATENT NO. : 8,981,850 B2
APPLICATION NO. : 13/750268
DATED : March 17, 2015
INVENTOR(S) : Boumaiza et al.

It is certified that error appears in the above-identified patent and that said Letters Patent is hereby corrected as shown below:

In the specification

Column 2, Lines 12-13 should read -- $V_{in} \geq \dfrac{V_{in,\max}}{p}$ --, therefor.

Column 2, Lines 19-20 should read -- $\dfrac{I_{aux}}{I_{main}} = \dfrac{p\alpha(p-1)}{1+(p-1)\alpha}$ --, therefor.

Column 3, Lines 36-48 should read $$\begin{bmatrix} -\sqrt{p} & 0 \\ 0 & -\dfrac{1}{\sqrt{p}} \end{bmatrix} = \begin{bmatrix} A & B \\ C & D \end{bmatrix}_{OCN_{main}} \begin{bmatrix} \cos^2\theta - \sqrt{2}\sin^2\theta & jR_T(1+\dfrac{1}{\sqrt{2}})\sin\theta\cos\theta \\ j\dfrac{1}{R_T}(1+\sqrt{2})\sin\theta\cos\theta & \cos^2\theta - \dfrac{1}{\sqrt{2}}\sin^2\theta \end{bmatrix} \begin{bmatrix} -\sqrt{\dfrac{p}{2}} & 0 \\ 0 & -\sqrt{\dfrac{2}{p}} \end{bmatrix}$$

--, therefor.

Signed and Sealed this
Twenty-eighth Day of June, 2016

Michelle K. Lee
*Director of the United States Patent and Trademark Office*

CERTIFICATE OF CORRECTION (continued)
U.S. Pat. No. 8,981,850 B2

In the specification

Column 3, Lines 63 – Column 4, Line 14 should read $$\begin{bmatrix} jp & jR_T \\ \dfrac{j}{R_T} & 0 \end{bmatrix} = \begin{bmatrix} A & B \\ C & D \end{bmatrix}_{OCN_{main}} \begin{bmatrix} \dfrac{\cos^2\theta - \sqrt{2}\sin^2\theta + j(1+\dfrac{1}{\sqrt{2}})\sin\theta\cos\theta}{\cos\theta + j\dfrac{1}{\sqrt{2}}\sin\theta} & jR_T\sin\theta \\ \dfrac{1}{R_T}\dfrac{\cos^2\theta - \dfrac{1}{\sqrt{2}}\sin^2\theta + j(1+\sqrt{2})\sin\theta\cos\theta}{\cos\theta + j\dfrac{1}{\sqrt{2}}\sin\theta} & \cos\theta \end{bmatrix} \begin{bmatrix} A & B \\ C & D \end{bmatrix}_{OCN_{sub}} \begin{bmatrix} 1 & 0 \\ \dfrac{p-2}{R_T} & 1 \end{bmatrix}$$

therefor.

Column 7, Lines 10-20 should read $$\begin{bmatrix} -\sqrt{p} & 0 \\ 0 & -\dfrac{1}{\sqrt{p}} \end{bmatrix} = \begin{bmatrix} A & B \\ C & D \end{bmatrix}_{OCN_{main}} \begin{bmatrix} \cos^2\theta - \sqrt{2}\sin^2\theta & jR_T(1+\dfrac{1}{\sqrt{2}})\sin\theta\cos\theta \\ j\dfrac{1}{R_T}(1+\sqrt{2})\sin\theta\cos\theta & \cos^2\theta - \dfrac{1}{\sqrt{2}}\sin^2\theta \end{bmatrix} \begin{bmatrix} -\sqrt{\dfrac{p}{2}} & 0 \\ 0 & -\sqrt{\dfrac{2}{p}} \end{bmatrix}$$

therefor.

Column 7, Lines 38-54 should read $$\begin{bmatrix} jp & jR_T \\ \dfrac{j}{R_T} & 0 \end{bmatrix} = \begin{bmatrix} A & B \\ C & D \end{bmatrix}_{OCN_{main}} \begin{bmatrix} \dfrac{\cos^2\theta - \sqrt{2}\sin^2\theta + j(1+\dfrac{1}{\sqrt{2}})\sin\theta\cos\theta}{\cos\theta + j\dfrac{1}{\sqrt{2}}\sin\theta} & jR_T\sin\theta \\ \dfrac{1}{R_T}\dfrac{\cos^2\theta - \dfrac{1}{\sqrt{2}}\sin^2\theta + j(1+\sqrt{2})\sin\theta\cos\theta}{\cos\theta + j\dfrac{1}{\sqrt{2}}\sin\theta} & \cos\theta \end{bmatrix} \begin{bmatrix} A & B \\ C & D \end{bmatrix}_{OCN_{sub}} \begin{bmatrix} 1 & 0 \\ \dfrac{p-2}{R_T} & 1 \end{bmatrix}$$

therefor.

Column 10, Lines 24-35 should read $$\begin{bmatrix} -\sqrt{p} & 0 \\ 0 & -\frac{1}{\sqrt{p}} \end{bmatrix} = \begin{bmatrix} A & B \\ C & D \end{bmatrix}_{OCN_{main}} \begin{bmatrix} \cos^2\theta - \sqrt{2}\sin^2\theta & jR_T(1+\frac{1}{\sqrt{2}})\sin\theta\cos\theta \\ j\frac{1}{R_T}(1+\sqrt{2})\sin\theta\cos\theta & \cos^2\theta - \frac{1}{\sqrt{2}}\sin^2\theta \end{bmatrix} \begin{bmatrix} -\sqrt{\frac{p}{2}} & 0 \\ 0 & -\sqrt{\frac{2}{p}} \end{bmatrix}$$

therefor.

Column 10, Lines 54-66 – Column 11, Lines 2-5 should read $$\begin{bmatrix} jp & jR_T \\ \frac{j}{R_T} & 0 \end{bmatrix} =$$

$$\begin{bmatrix} A & B \\ C & D \end{bmatrix}_{OCN_{main}} \begin{bmatrix} \dfrac{\cos^2\theta - \sqrt{2}\sin^2\theta + j(1+\frac{1}{\sqrt{2}})\sin\theta\cos\theta}{\cos\theta + j\frac{1}{\sqrt{2}}\sin\theta} & jR_T\sin\theta \\ \dfrac{1}{R_T}\dfrac{\cos^2\theta - \frac{1}{\sqrt{2}}\sin^2\theta + j(1+\sqrt{2})\sin\theta\cos\theta}{\cos\theta + j\frac{1}{\sqrt{2}}\sin\theta} & \cos\theta \end{bmatrix} \begin{bmatrix} A & B \\ C & D \end{bmatrix}_{OCN_{sub}} \begin{bmatrix} 1 & 0 \\ \frac{p-2}{R_T} & 1 \end{bmatrix}$$

therefor.